United States Patent
Nainani et al.

(10) Patent No.: US 9,378,941 B2
(45) Date of Patent: Jun. 28, 2016

(54) INTERFACE TREATMENT OF SEMICONDUCTOR SURFACES WITH HIGH DENSITY LOW ENERGY PLASMA

(71) Applicant: APPLIED MATERIALS, INC., Santa Clara, CA (US)

(72) Inventors: Aneesh Nainani, Palo Alto, CA (US); Bhushan N. Zope, Santa Clara, CA (US); Leonid Dorf, San Jose, CA (US); Shahid Rauf, Pleasanton, CA (US); Adam Brand, Palo Alto, CA (US); Mathew Abraham, Mountain View, CA (US); Subhash Deshmukh, North Andover, MA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 24 days.

(21) Appl. No.: 14/064,933

(22) Filed: Oct. 28, 2013

(65) Prior Publication Data
US 2015/0093862 A1    Apr. 2, 2015

Related U.S. Application Data

(60) Provisional application No. 61/885,688, filed on Oct. 2, 2013.

(51) Int. Cl.
| | | |
|---|---|---|
| H01L 21/02 | (2006.01) |
| H01L 29/66 | (2006.01) |
| H01L 21/768 | (2006.01) |
| H01L 21/3065 | (2006.01) |
| H01J 37/32 | (2006.01) |
| H01L 21/8238 | (2006.01) |
| H01L 21/8258 | (2006.01) |

(52) U.S. Cl.
CPC ....... *H01L 21/02063* (2013.01); *H01J 37/3233* (2013.01); *H01L 21/02057* (2013.01); *H01L 21/3065* (2013.01); *H01L 21/76814* (2013.01); *H01L 21/8258* (2013.01); *H01L 21/823807* (2013.01); *H01L 29/66795* (2013.01); *H01L 21/02661* (2013.01); *H01L 21/823821* (2013.01)

(58) Field of Classification Search
None
See application file for complete search history.

(56) References Cited

U.S. PATENT DOCUMENTS

| | | | |
|---|---|---|---|
| 2002/0094693 A1* | 7/2002 | Yang et al. | 438/712 |
| 2002/0098627 A1* | 7/2002 | Pomarede et al. | 438/149 |
| 2006/0051959 A1* | 3/2006 | Iwatake et al. | 438/643 |
| 2006/0246640 A1* | 11/2006 | Kuwashima et al. | 438/151 |
| 2007/0126035 A1* | 6/2007 | Ernst et al. | 257/288 |
| 2008/0029754 A1* | 2/2008 | Min et al. | 257/4 |
| 2008/0152903 A1 | 6/2008 | Von Kaenel | |
| 2011/0027999 A1* | 2/2011 | Sparks et al. | 438/712 |
| 2011/0037960 A1 | 2/2011 | Scaccabarozzi et al. | |
| 2011/0116992 A1* | 5/2011 | North et al. | 422/503 |
| 2011/0122486 A1* | 5/2011 | Busch et al. | 359/359 |
| 2011/0287324 A1* | 11/2011 | Rajaram et al. | 429/246 |
| 2012/0032234 A1* | 2/2012 | Wang et al. | 257/200 |
| 2012/0097870 A1* | 4/2012 | Leray et al. | 250/505.1 |
| 2013/0098872 A1 | 4/2013 | Dorf et al. | |
| 2013/0252240 A1 | 9/2013 | Cutler et al. | |

FOREIGN PATENT DOCUMENTS

KR    10-2005-0014107 A    2/2005

\* cited by examiner

*Primary Examiner* — Calvin Choi
*Assistant Examiner* — Xiaoming Liu
(74) *Attorney, Agent, or Firm* — Robert M. Wallace

(57) ABSTRACT

An electron beam plasma source is used in a soft plasma surface treatment of semiconductor surfaces containing Ge or group III-V compound semiconductor materials.

11 Claims, 11 Drawing Sheets

INTERFACE TREATMENT OF SEMICONDUCTOR SURFACES WITH HIGH DENSITY LOW ENERGY PLASMA

CROSS-REFERENCE TO RELATED APPLICATION

This application claims the benefit of U.S. Provisional Application Ser. No. 61/885,688 filed Oct. 2, 2013 entitled INTERFACE TREATMENT OF SEMICONDUCTOR SURFACES WITH HIGH DENSITY LOW ENERGY PLASMA, by Aneesh Nainani et al.

BACKGROUND

1. Technical Field

The disclosure concerns methods of passivating, cleaning or reducing oxides from semiconductor surfaces.

2. Background Discussion

Wet cleaning is a semiconductor process for cleaning or functionalizing the semiconductor surface prior to process operations involving gate dielectric deposition or contact formation, for example. In wet cleaning, wafers to be cleaned are submerged in a bath of a cleaning agent, such an aqueous solution of HF, for example. As semiconductor structures are changing to include 3-dimensional (3D) shapes such as fin-FET devices with ever-increasing aspect ratios, wet cleaning will create more problems. The term finFET refers to a field effect transistor (FET) formed on a semiconductor structure shaped as a thin wall (or fin) of semiconductor material. The fin serves as a 3-dimensional structure, in which are formed source and drain regions and a channel between them, all formed as adjacent 3-dimensional sections of the fin. A gate overlies the channel on three sides of the wall. The complete structure is a field effect transistor (FET) and is referred to as a finFET.

One of the main problems with wet cleaning is that it will cause collapse of the device (e.g., the fin structure) at higher aspect ratios.

In the cleaning of high aspect ratio structures such as those involved in finFET devices, the deformation caused by surface tension and capillary forces involved in wet cleaning can cause collapse of the device (e.g., the fin). The scaling roadmap of these devices requires further reduction in the device width L and inter-device distance d, while the feature height H is expected to increase, which will further aggravate the problems associated with pattern collapse. The structural deformation depends inversely on d and $L^3$ and is proportional to $H^4$. Theoretical modeling indicates that pattern collapse due to wet cleaning will start to become a significant problem at the aspect ratios and dimensions required for 10 nm node devices sizes.

Another problem associated with wet cleaning is that of substrate (workpiece) consumption, which was not a concern for planar devices. However, for 3D devices (such as finFET structures), even 1 nm of substrate consumption on both sides of the device (or fin) can lead to 25% reduction in the fin width, for an 8 nm wide fin. To avoid these issues, an alternative to wet cleaning is needed.

One more challenge in cleaning of Ge and group III-V compound semiconductor surfaces is the high surface reactivity of these materials. Ge—Ge and group III-V compound bonds have lower bond enthaplies as compared to silicon, as shown below in Table 1.

TABLE 1

| Bond | Energy (eV) |
|---|---|
| Ge—Ge | 2.63 |
| Ge—O | 6.59 |
| Ge—H | 3.21 |
| Si—Si | 3.28 |
| Si—H | 2.99 |
| In—As | 2.01 |
| Ga—As | 2.09 |

Traditional plasma sources such as inductively coupled sources and capacitively coupled sources have plasma ion energy ranges above the bond energies of many of the materials of Table 1 and are known to cause significant surface damage on some materials listed in the table, particularly the materials having bonding energies below the Si—Si bonding energy, such as those found in group III-V compound semiconductor elements. Dangling Ge and group III/V element bonds on the surface are the root cause of high density of interface states and Fermi level pinning which is detrimental for transistor performance.

SUMMARY

A method for fabricating a semiconductor structure, comprises etching a semiconductor workpiece to form a semiconductor structure having a surface, providing an electron beam that propagates through a processing zone overlying the surface in a propagation direction generally parallel to a plane of the workpiece, and introducing into the chamber a process gas comprising at least one of: (a) a cleaning species precursor, (b) a passivation species precursor, (c) an oxide reduction species precursor, to produce a plasma.

In one embodiment, the method further comprises maintaining an ion energy level of the plasma below a bonding energy of a material of the surface.

In a related embodiment, the method further comprises forming in the surface at least one of: (a) N-MOS regions comprising group III-V compound semiconductor materials, (b) P-MOS regions comprising Ge or Ge-containing materials. In one embodiment, the process gas comprises a passivation species precursor gas comprising Nitrogen. In another embodiment, the process gas comprises a native oxide removal species precursor gas comprising Hydrogen. In a yet further embodiment, the process gas comprises a cleaning species precursor gas comprising at least one of HBr or HCl.

In one embodiment, the method further comprises coupling RF bias power to the workpiece during the producing of the plasma with the electron beam, and adjusting the level of the RF bias power so as to increase the level of ion energy of the plasma to at least approach the bonding energy of the material of the surface. In a related embodiment, the method further comprises exposing the workpiece to the plasma until a selected number of atomic layers has been removed from the surface. In such an embodiment, an atomic layer etch of the surface is performed.

In one embodiment, the N-MOS regions are formed by epitaxially growing materials of (a) Ge and (b) group III-V compounds in alternating operations, and after each operation of epitaxial growing material of Ge and prior to each operation of epitaxial growing of group III-V compound material, performing a soft plasma surface treatment process. The soft plasma surface treatment process comprises: (a) directing an electron beam into a processing zone of a chamber containing said semiconductor workpiece, said electron beam propagating through said processing zone in a propagation direction generally parallel to a plane of said surface; (b) introducing into said chamber a process gas comprising a surface treatment precursor.

In one embodiment, the P-MOS regions are formed by epitaxially growing materials containing at least one of (a) Ge or (b) Ge and Si in the surface.

In accordance with an embodiment, the process gas comprises a native oxide removal species precursor gas, and the method further comprises depositing an interface oxide layer on the surface.

Another method for fabricating a semiconductor structure comprises: (a) etching a semiconductor workpiece to form a semiconductor structure having a surface, (b) forming recesses in the surface, and (c) cleaning exposed portions of the recesses in a soft plasma treatment process. The soft plasma treatment process comprises providing an electron beam that propagates through a processing zone overlying the surface in a propagation direction generally parallel to a plane of the workpiece, and introducing into the chamber a process gas comprising a surface treatment species precursor.

In one embodiment, the recesses comprise P-MOS recesses, and the method further comprises growing epitaxial layers of Ge or Ge-containing materials in the P-MOS recesses.

In one embodiment, the recesses comprise N-MOS recesses, and the method further comprises growing epitaxial layers of group III-V compound materials in the N-MOS recesses.

In one embodiment, the process gas comprises one of: (a) a cleaning species precursor, (b) a passivation species precursor, (c) an oxide reduction species precursor. In a related embodiment, the process gas comprises a cleaning species precursor, the cleaning species precursor comprising one of HBr or HCl. In another related embodiment, the process gas comprises a passivation species precursor, the passivation species precursor comprising Nitrogen. In yet another related embodiment, the process gas comprises an oxide reduction species precursor, the oxide reduction species precursor comprising Hydrogen.

A yet further embodiment of a method for fabricating a semiconductor structure comprises: (a) etching a semiconductor workpiece to form a semiconductor structure having a surface, the surface covered by a layer comprising at least one of an oxide or a nitride, (b) etching through the layer to form contact openings to the surface, (c) cleaning areas of the surface exposed by the forming of the contact openings. The cleaning is performed by: (a) generating an electron beam propagating parallel to a plane of the workpiece through a processing zone overlying the surface, (b) introducing a cleaning species precursor process gas into the processing zone to form a plasma in the processing zone. The method further comprises depositing a metal in the contact openings.

In one embodiment, the surface is formed of (a) Ge or (b) group III-V compounds, and the cleaning further comprises maintaining the plasma at an ion energy level less than a bonding energy of materials on the surface.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIGS. 3A through 3G depict a sequence of processes in fabrication of a finFET, of which:

FIG. 3A depicts a process for removing damaged surface layers from the surface of a finFET.

FIG. 3B depicts a process for growing epitaxial semiconductor materials in the N-MOS and P-MOS regions of the wafers.

FIG. 3C depicts a process for exposing fin surfaces and removing native oxide from the exposed fin surfaces.

FIG. 3D depicts a process for forming P-MOS epitaxial regions of Ge or Ge-containing materials in P-MOS recesses on the surface of the workpiece, and for forming N-MOS epitaxial regions of III-V compound materials Ge or Ge-containing materials in N-MOS recesses on the workpiece.

FIG. 3E depicts a process for forming an interface oxide layer in the P-MOS regions of the fin.

FIG. 3F depicts a process for forming an interface oxide layer in the N-MOS regions of the fin.

FIG. 3G depicts a process for forming contacts in the N-MOS and P-MOS regions of the fin.

Figure 1:
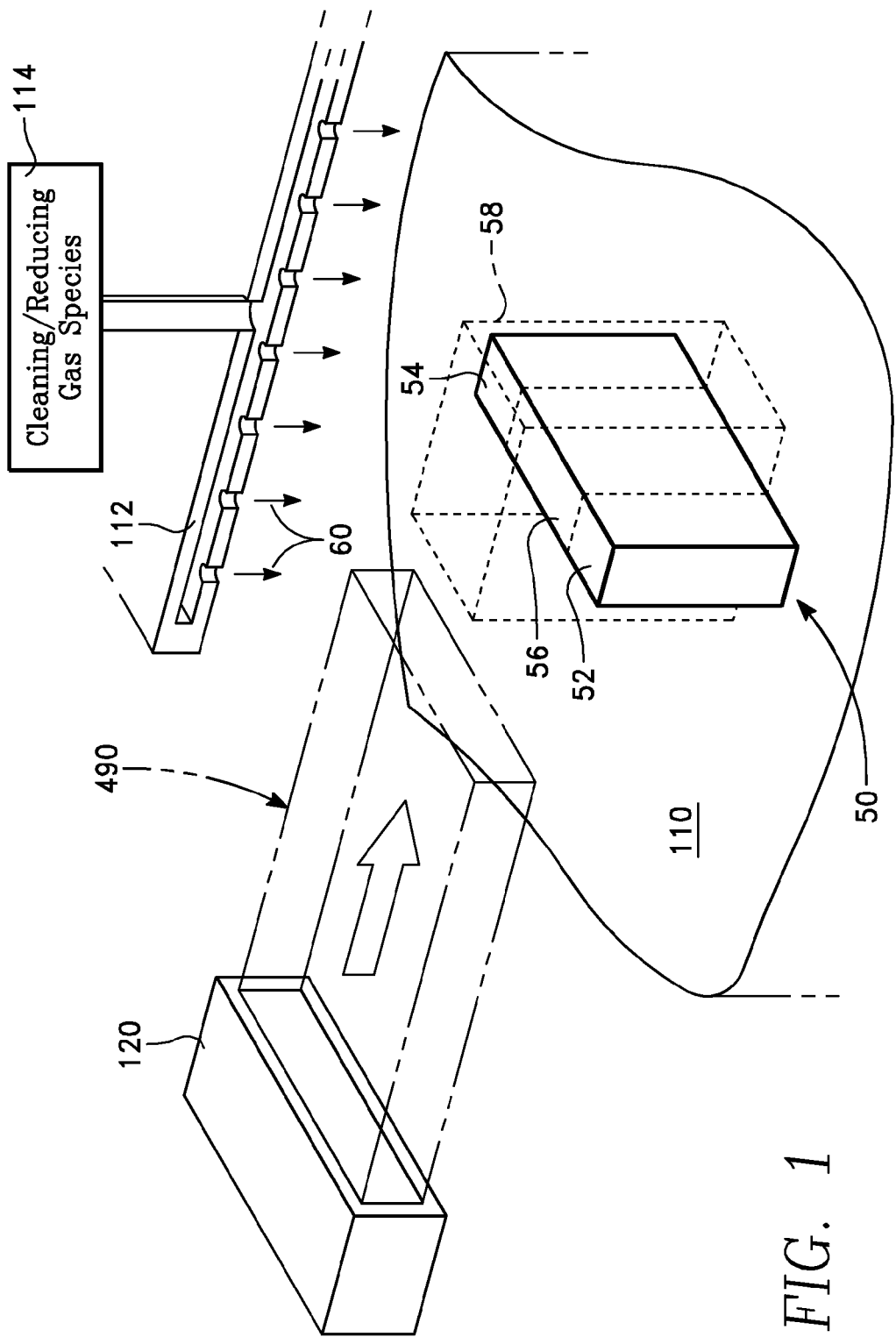
FIG. 1 is a conceptual diagram depicting an embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Embodiments disclosed herein concern dry cleaning of semiconductor workpieces (e.g., wafers). Of particular interest is the application to surface cleaning and passivation of semiconductor materials needed for making the next generation of transistor devices, e.g., silicon germanium (SiGe), germanium (Ge) and group III-V compound semiconductor materials, such as $In_{0.47}Ga_{0.53}As$, GaAs, InAs, and the like. These embodiments address a problem of providing an effective way of surface cleaning, removing the native oxides and carbon contaminants, without using a wet chemistry. To achieve that, these embodiments employ a plasma source that produces high-density plasma with very low ion energy, which can be used for a variety of chemistries needed for effective cleaning of Ge and group III-V compound semiconductor wafers. Unlike other dry cleaning methods, embodiments disclosed herein are capable of cleaning the semiconductor surface without causing surface damage and without breaking semiconductor bonds.

The disclosed embodiments employ a plasma source which produces a high density plasma with very low ion energy, which is suitable for cleaning of semiconductor surfaces without producing any damage. This plasma source is one in which an electron beam propagates through the process zone of a plasma chamber as a sheet parallel to the workpiece plane (the wafer plane). A process gas in the chamber is ionized by the electron beam for plasma generation to process the workpiece. Such a plasma source is referred to herein as an electron beam plasma source. A salient feature of the electron beam plasma source pertinent to surface cleaning and passivation is that it provides an order of magnitude reduction in electron temperature (Te) (~0.5 eV) and ion energy compared to conventional plasma technologies (>3 eV) such as inductively coupled or capacitively coupled plasma sources. An electron beam plasma source provides a high density plasma (~2-2.5×10$^{10}$/cm3) with very low electron temperature (~0.3 eV). The resulting ion energies are tightly packed around very low energy maxima of ~0.72 eV. Comparing these energies with the bond enthalpies in Table 1 discussed above, energies of the ions produced in the electron beam plasma source are lower than the bonding energies of the semiconductors materials of Table 1. Therefore, using an electron beam plasma source provides an effective way to clean semiconductor surfaces without causing damage.

Multiple gas lines can be coupled to the process gas distribution apparatus of the electron beam plasma source, allowing exploration of different chemistries.

One embodiment employs a Nitrogen-based process gas in the electron beam plasma source, to produce a Nitrogen-containing plasma which is effective in passivation of Ge and group III-V compound semiconductor surfaces. Another embodiment employs a mixture of Nitrogen and Hydrogen process gases in the electron beam plasma source, to create $NH_x$ radicals or to cycle through Nitrogen and Hydrogen, where the Hydrogen dissociated plasma species are used for reducing the native oxides on the semiconductor surface and the Nitrogen dissociated plasma species are used for surface passivation. In another embodiment, the process gas fed to the electron beam plasma source is a gaseous form of HBr or HCl, for effectively cleaning and passivating group III-V compound semiconductor surfaces.

A salient feature of this method is that it is readily scalable to large workpiece (wafer) diameters (>450 mm) and can use both ions and radicals. This compares favorably to remote plasma schemes which are limited to furnishing radicals only, and suffer from non-uniformity.

In accordance with a yet further embodiment, an optional RF bias power generator is coupled to an electrode in the workpiece support. This augments the low electron temperatures of the electron beam plasma source with a very mild controllable bias for precise control of ion energy, to generate plasmas which have energies in the same order of magnitude as bonding energies of the semiconductor material in the surface being cleaned, passivated or reduced. This feature enables etching of the first one or two monolayers of the semiconductor surface at a highly controllable (limited or slow) rate. Significantly, most of the defects and roughness in the semiconductor surface remaining after removal of the oxide reside in the first few monolayers of the surface. This latter embodiment can enable a combination of surface clean and atomic layer etch (ALE).

FIG. 1 is a conceptual diagram depicting an embodiment. A workpiece 110, which may be a semiconductor wafer, has an array of nanometer-sized semiconductor fins 50 formed on its top surface as separate thin wall structures extending orthogonal to the top surface of the workpiece 110. The fins 50 may include source and drain regions 52, 54, respectively, defining between them a source-drain channel 56. A 3-dimensional gate structure 58 may overlie the top and straddle the sides of the source-drain channel 56. A process gas 60 containing a cleaning species or a reducing species is injected over the workpiece 110 in an axial direction (relative to the axis of symmetry of the workpiece 110). The process gas 60 is furnished from a process gas supply 114 by through a process gas distribution plate 112 facing the top surface of the workpiece 110. An electron beam 490 from an electron beam generator 120 propagates as a planar sheet in a direction transverse to the axial gas flow direction and generally parallel to the top surface or plane of the workpiece 110. The process gas 60 is ionized by the electron beam 490, and dissociated plasma species are generated and travel to the top surface of the workpiece 110, where they clean or passivate the surface of each fin 50 or reduce oxide on the fin surface.

Figure 1A:
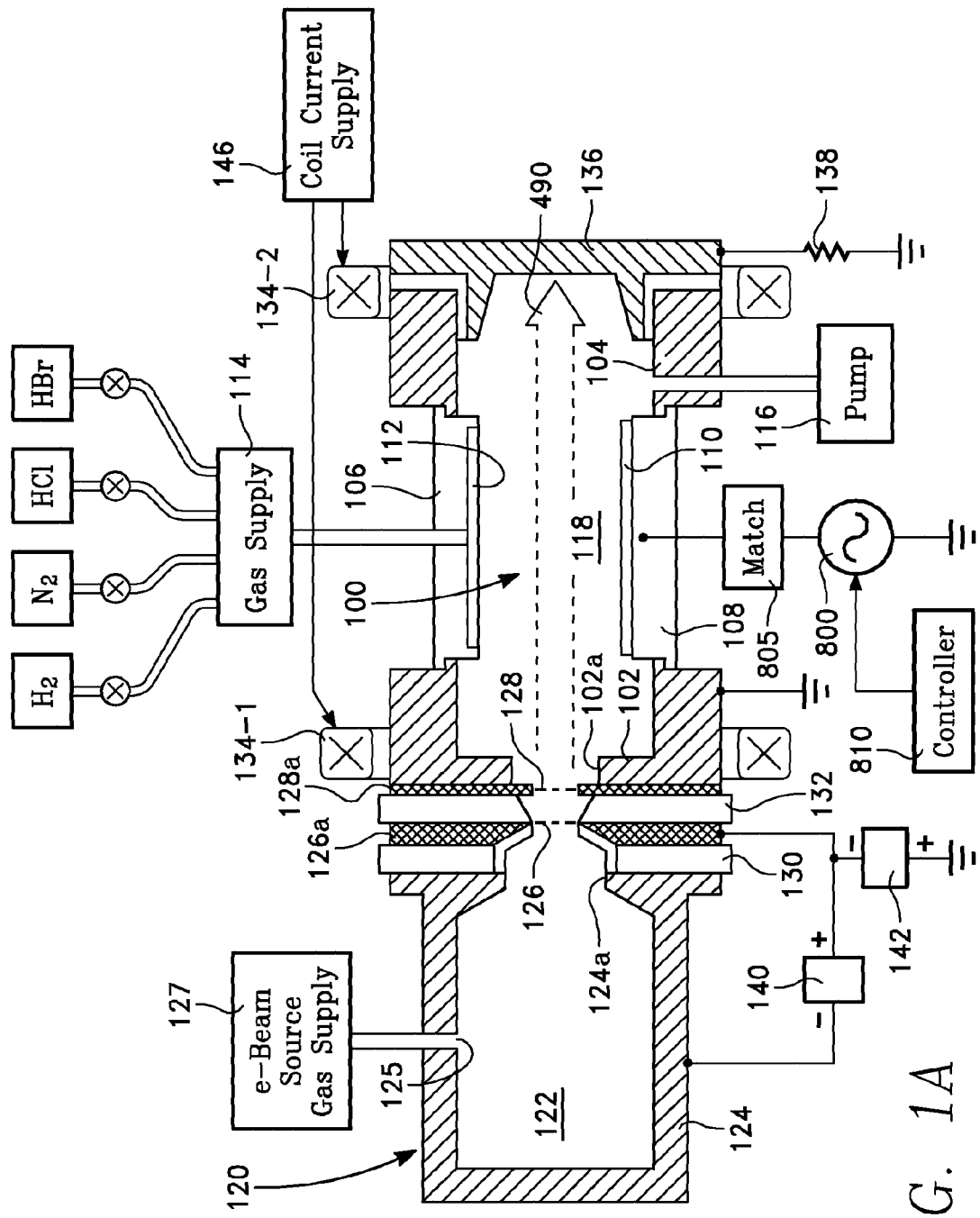
FIG. 1A depicts an implementation of an electron beam plasma source relative to the embodiment of FIG. 1.
Figure 1B:
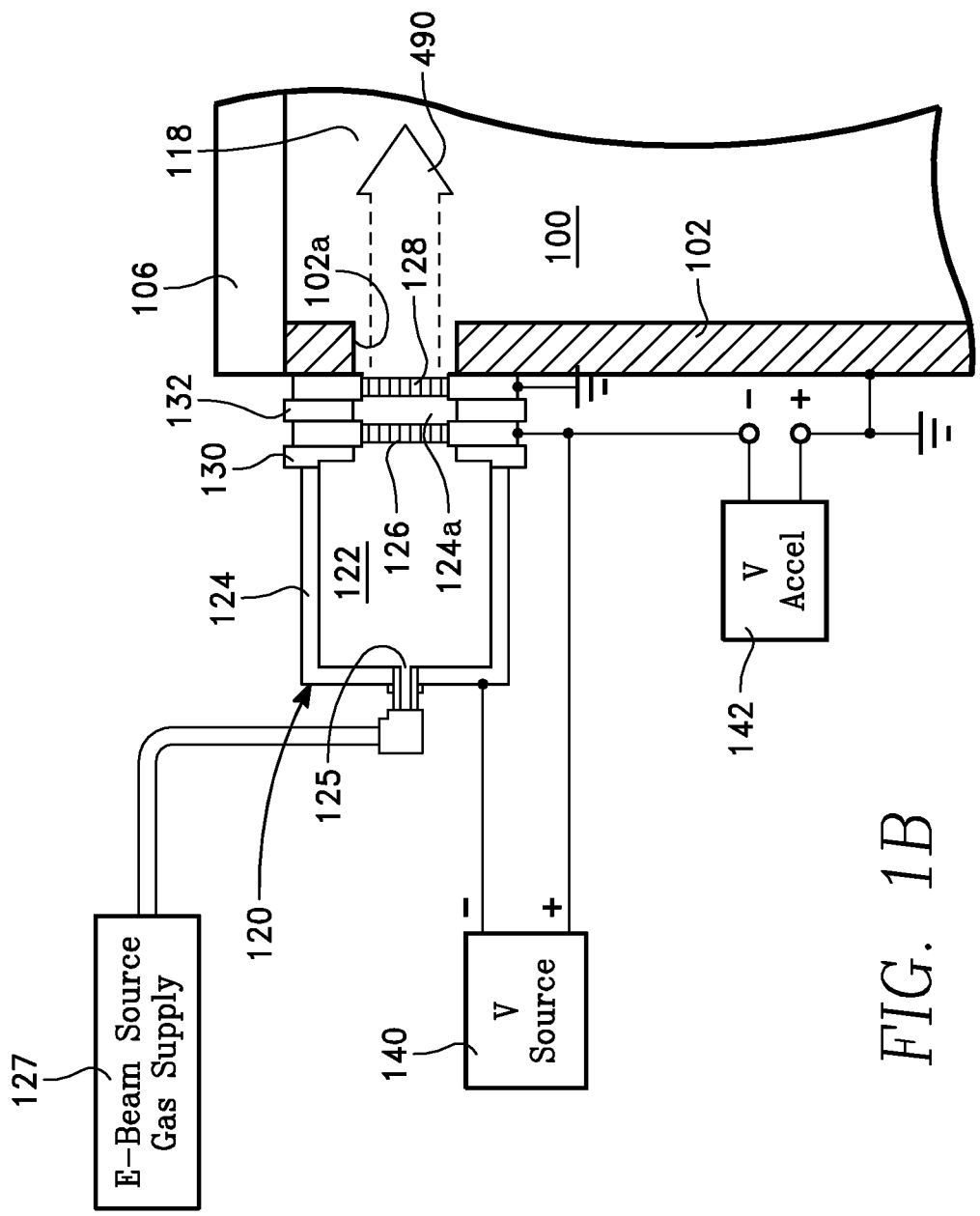
FIG. 1B is an enlarged view of a portion of FIG. 1A.

FIGS. 1A and 1B depict one way in which the electron beam generator 120 may be integrated with a plasma reactor to form an electron beam plasma source that includes the gas distribution plate 112. The plasma reactor includes a processing chamber 100 enclosed by a cylindrical side wall 102, a floor 104 and a ceiling 106. A workpiece support pedestal 108 supports the workpiece 110, which may be a semiconductor wafer, the pedestal 108 being movable in the axial (e.g., vertical) direction. The gas distribution plate 112 is integrated with or mounted on the ceiling 106, and receives process gas from a process gas supply 114. As indicated in FIG. 1A, the process gas supply 114 may provide any one of various precursor species, such as an oxide reducing precursor gas (Hydrogen), a passivation precursor gas (a) or cleaning precursor (HCl or HBr) effective for native oxide reduction, passivation or cleaning of semiconductor surfaces. A vacuum pump 116 evacuates the chamber through a passage in the floor 104. A processing region 118 is defined between the workpiece 110 and the gas distribution plate 112. Within the processing region 118, the process gas is ionized to produce a plasma for processing of the workpiece 110.

The plasma is generated in the processing region 118 by an electron beam 490 from an electron beam generator 120. The electron beam generator 120 includes a plasma generation chamber 122 spaced from the processing chamber 100 and having a conductive enclosure 124. The conductive enclosure 124 has a gas inlet 125. An electron beam source gas supply 127 is coupled to the gas inlet 125, and may furnish an inert gas, as one possible example. The conductive enclosure 124 has an opening 124a facing the processing region 118 through an opening 102a in the sidewall 102 of the processing chamber 100.

The electron beam generator 120 includes an extraction grid 126 adjacent the opening 124a and the plasma generation chamber 122, and an acceleration grid 128 adjacent the extraction grid 126 facing the processing region 118, best seen in the enlarged view of FIG. 1B. The extraction grid 126 and the acceleration grid 128 may each be formed as either a conductive mesh or a slotted electrode, for example, and are herein referred to generically as grids. Electrical contact to the extraction grid 126 is provided by a conductive ring 126a surrounding the extraction grid. Electrical contact to the acceleration grid 128 is provided by a conductive ring 128a surrounding the acceleration grid 128. The extraction grid 126 and the acceleration grid 128 are mounted with insulators 130, 132, respectively, so as to be electrically insulated from one another and from the conductive enclosure 124. However, the acceleration grid 128 is in electrical contact with the side wall 102 of the chamber 100. The openings 124a and 102a and the extraction and acceleration grids 126, 128 are mutually congruent, generally, and define a thin wide flow path for an electron beam into the processing region 118. The width of the flow path is about the diameter of the workpiece 110 (e.g., 100-400 mm) while the height of the flow path is less than about two inches.

The electron beam generator 120 further includes a pair of electromagnets 134-1 and 134-2 adjacent opposite sides of the chamber 100, the electromagnet 134-1 being near the electron beam generator 120. The two electromagnets 134-1 and 134-2 produce a magnetic field parallel to the electron beam path. The electron beam 490 flows across the processing region 118 over the workpiece 110, and is absorbed on the opposite side of the processing region 118 by a beam dump 136. The beam dump 136 is a conductive body having a shape adapted to capture the wide thin electron beam. The beam dump 136 may be coupled to ground through a shunt resistor 138.

A negative terminal of a plasma D.C. discharge voltage supply 140 is coupled to the conductive enclosure 124, and a positive terminal of the voltage supply 140 is coupled to the extraction grid 126. In turn, a negative terminal of an electron beam acceleration voltage supply 142 is connected to the extraction grid 126, and a positive terminal of the voltage supply 142 is connected to the ground. In one embodiment the acceleration grid 128 is grounded. The acceleration voltage supply 142 is connected between the extraction grid 126 and the acceleration grid 128. A coil current supply 146 is coupled to the electromagnets 134-1 and 134-2. In one embodiment, plasma is generated within the chamber 122 of the electron beam generator 120 by a D.C. gas discharge produced by power from the voltage supply 140. Electrons are extracted from the plasma in the chamber 122 through the extraction grid 126 and the acceleration grid 128 to produce an electron beam 490 that flows into the processing chamber 100. Electrons are accelerated to energies equal to the voltage provided by the acceleration voltage supply 142.

The electron beam generator 120 may employ any other suitable plasma source, such as a capacitively coupled plasma source, an inductively coupled plasma source or a toroidal plasma source.

As depicted in FIG. 1A, an optional RF bias power generator 800 may be coupled through a bias impedance match 805 to the workpiece support pedestal 108 to facilitate an atomic layer etch process. Without the bias power generator 800, the plasma ion energy is below the bonding energy of most semiconductor materials, for non-destructive surface passivation or cleaning. If an atomic layer etch process is to be performed, the power level of the bias power generator 800 is increased by a controller 810 until the plasma ion energy reaches or slightly surpasses the surface material bonding energy (as in Table 1). At this point, surface material begins to be gradually removed. This conditioned is maintained until the first one or two monolayers of surface material have been removed.

Embodiments include plasma processes for surface cleaning, surface passivation or reduction of surface oxide on a workpiece surface using a high density plasma having a very low ion energy produced by the electron beam plasma source. Each of these plasma processes involves a low energy high density plasma process, or a soft plasma surface treatment process, for surface cleaning, surface passivation, surface oxide reduction and atomic layer etch. An embodiment of such a soft plasma surface treatment process is depicted in FIG. 2.

Figure 2:
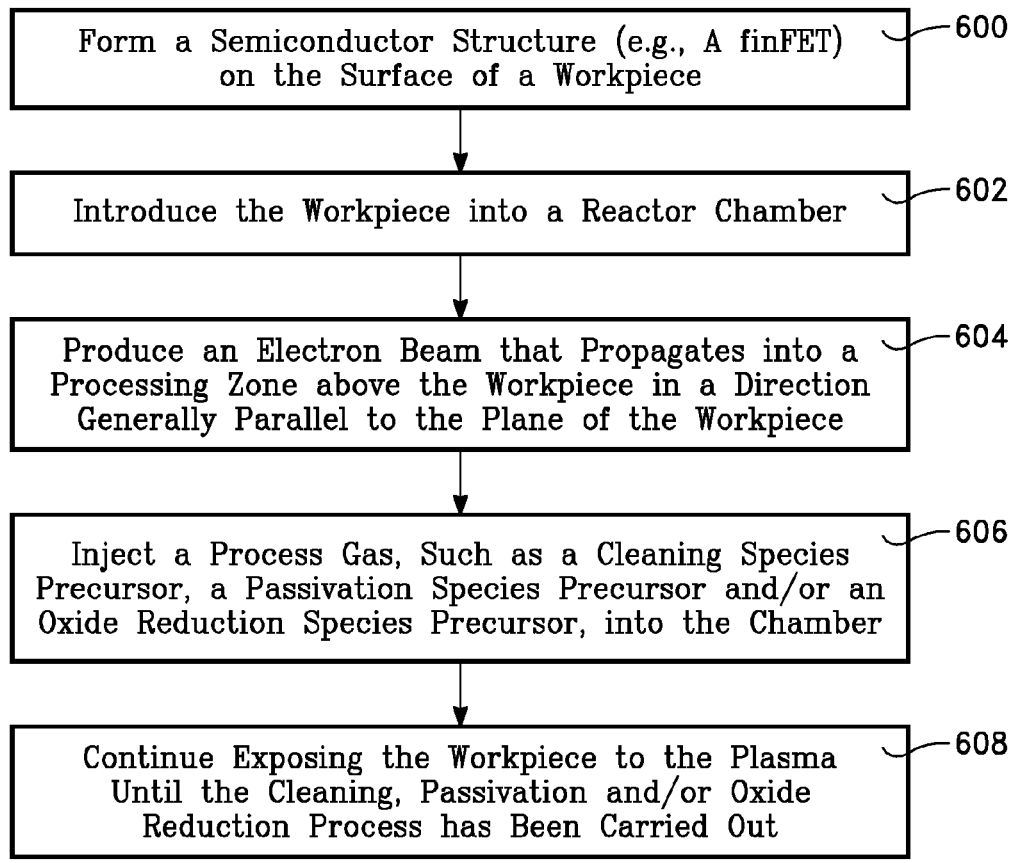
FIG. 2 is a block flow diagram depicting a soft plasma surface treatment process in one embodiment.

Referring now to FIG. 2, a structure (e.g., a semiconductor finFET) is formed on the surface of a workpiece or wafer (block 600 of FIG. 2). The workpiece is introduced into a reactor chamber (block 602 of FIG. 2). An electron beam is produced that propagates to the chamber and into a processing zone above the workpiece in a direction generally parallel to the plane of the workpiece (block 604 of FIG. 2). A process gas, such as a cleaning species precursor, a passivation species precursor and/or an oxide reduction species precursor, is injected into the chamber (block 606 of FIG. 2). In one embodiment, the gas injection direction is toward the workpiece top surface. The electron beam ionizes the process gas to produce a plasma including dissociated species (e.g., ions and radicals) for passivation, cleaning or oxide reduction, depending upon the type of process gas employed. The workpiece is exposed to this plasma until the cleaning, passivation and/or oxide reduction has been carried out. This completes the soft plasma surface treatment process.

Different applications of the soft plasma surface treatment process of FIG. 2 can involve treating the semiconductor surfaces of a finFET during different stages of an overall finFET fabrication sequence. Some of these applications will now be described with reference to a partial fabrication sequence of FIGS. 3A through 3G. Each application is described relative to the stage of the overall fabrication sequence in which the respective application is employed. The sequence of FIGS. 3A through 3G omits some fabrication processes not directly employing a soft plasma surface treatment process. In the following description, reference is made to P-MOS and N-MOS regions on the workpiece, whose locations are predetermined.

Figure 3A:
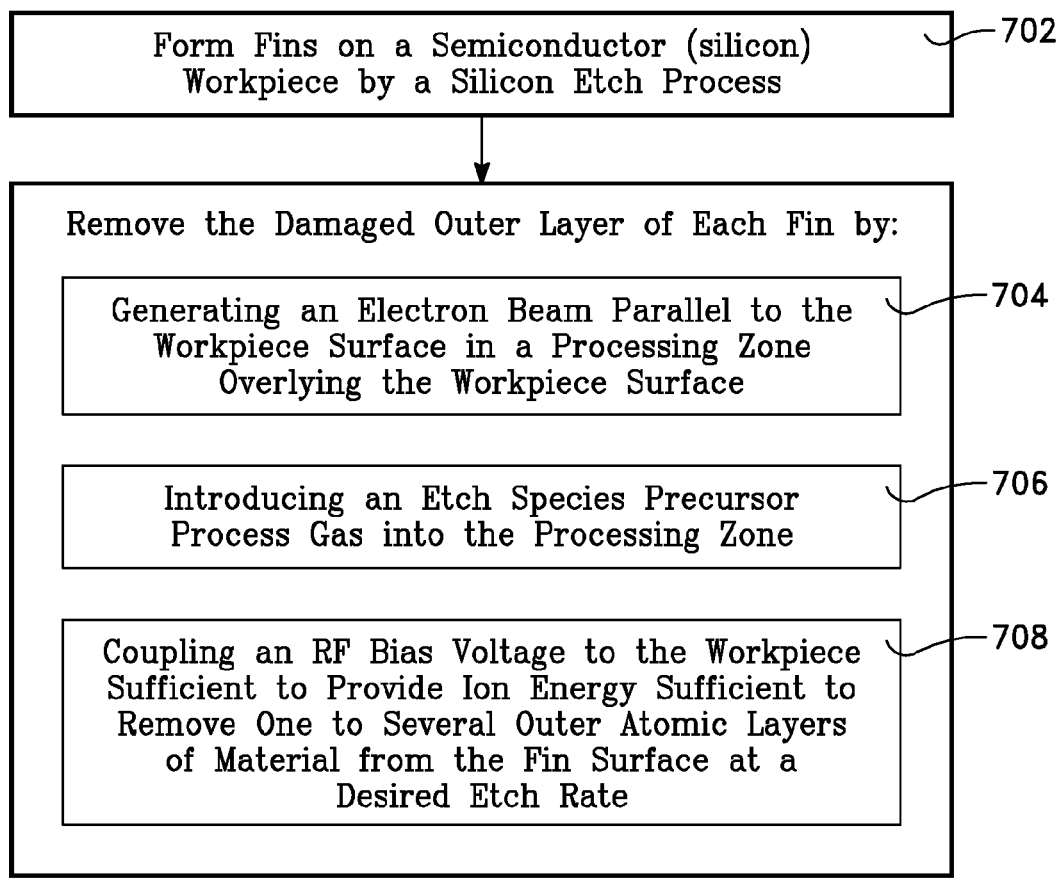

The process of FIG. 3A removes damaged surface layers from the fin. In the process of FIG. 3A, an atomic layer etch process may be performed in which the optional bias power generator 800 of FIG. 1A may be employed to increase the plasma ion energy to be near or slightly above the bonding energy of the fin surface material. The process of FIG. 3A proceeds as follows: fins are formed on a semiconductor (silicon) workpiece by a silicon etch process (block 702 of FIG. 3A). The damaged outer layer of each fin is removed in a soft plasma surface treatment process by: (A) generating an electron beam parallel to the workpiece surface in a processing zone overlying the workpiece surface (block 704 of FIG. 3A), (B) introducing an etch species precursor process gas into the processing zone (block 706 of FIG. 3A), and (C) coupling an RF bias voltage to the workpiece sufficient to provide an ion energy sufficient to remove one to several outer atomic layers of material from the fin surface at a desired etch rate (block 708 of FIG. 3A). The RF bias voltage may be furnished by the optional RF bias power generator 800 of FIG. 1A described above.

Figure 3B:
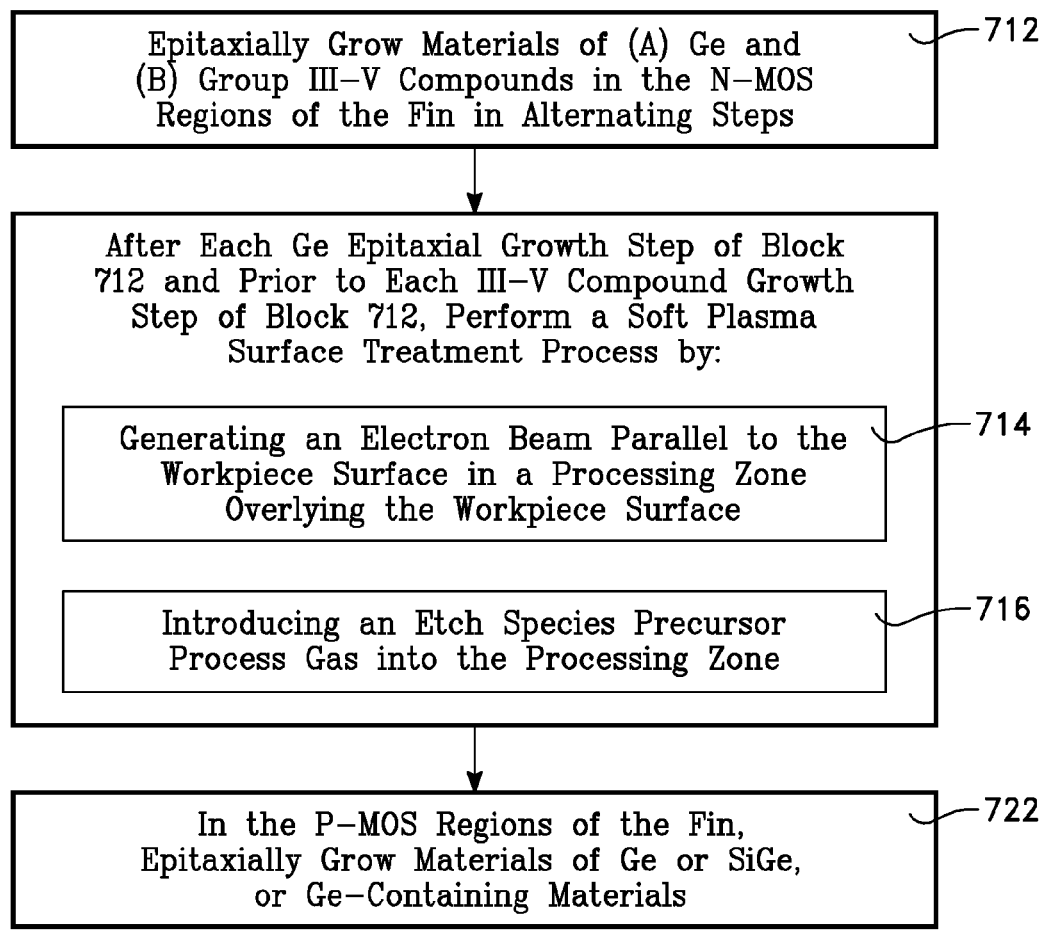

The process of FIG. 3B forms epitaxial growth materials in the N-MOS and P-MOS regions in the fin. The epitaxial growth of materials in the N-MOS regions of the fin proceeds as follows: a first operation is performed of epitaxially growing materials of Ge or containing Ge in the N-MOS regions of the fin, followed by a second operation of epitaxially growing materials of group III-V compound material in the N-MOS regions of the fin. The first and second operations are successively repeated (block 712 of FIG. 3B). After each first operation of Ge epitaxial growth and prior to each second operation of group III-V compound epitaxial growth, a soft plasma surface treatment process is performed, by: (A) generating an electron beam parallel to the workpiece surface in a processing zone overlying the workpiece surface (block 714 of FIG. 3), (B) introducing an etch species precursor process gas into the processing zone (block 716 of FIG. 3B). After completion of the epitaxial growth of materials in the N-MOS regions, materials of Ge or SiGe, or Ge-containing materials are epitaxially grown in the P-MOS regions of the fin, (block 722 of FIG. 3B).

Figure 3C:
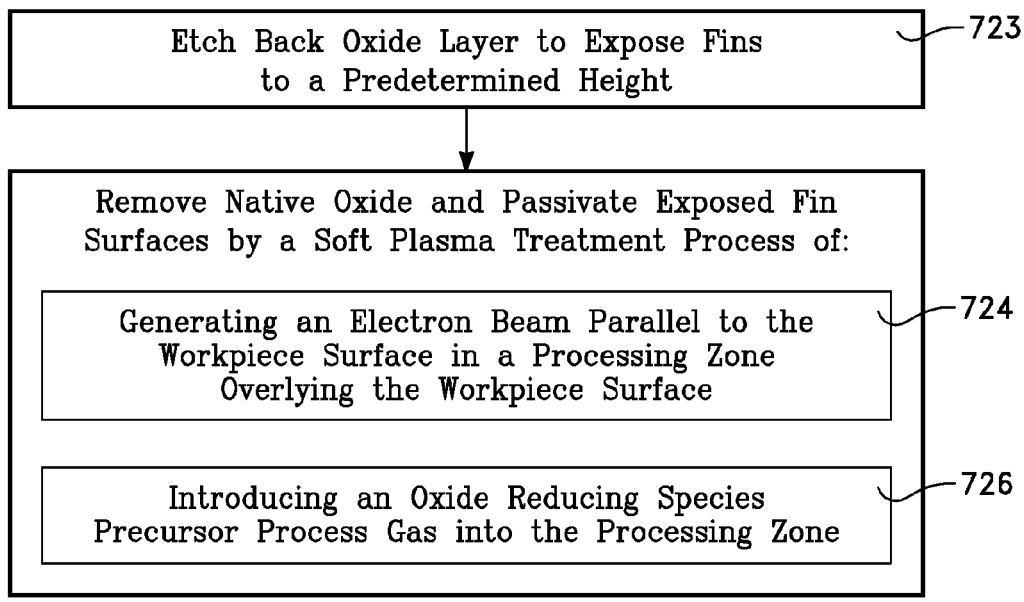

The process of FIG. 3C exposes and removes native oxide from fin surfaces, as follows: etching back an oxide layer to expose fins to a predetermined height (block 723 of FIG. 3C); removing native oxide and passivating exposed fin surfaces by a soft plasma treatment process of: (A) generating an electron beam parallel to the workpiece surface in a processing zone overlying the workpiece surface (block 724 of FIG. 3C), and (B) introducing an oxide reducing species precursor process gas into the processing zone (block 726 of FIG. 3C).

Figure 3D:
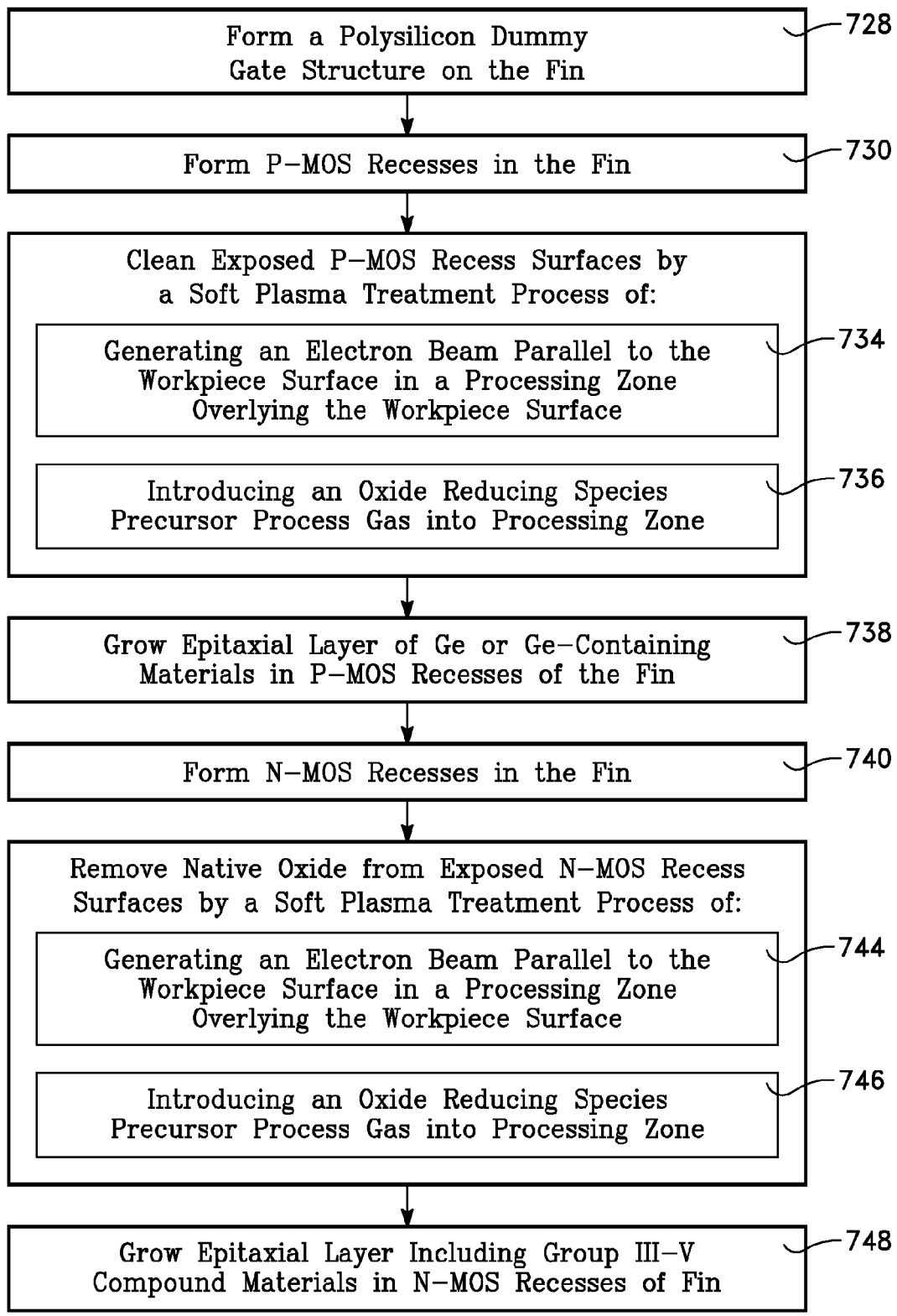

The process of FIG. 3D forms P-MOS epitaxial regions of Ge or Ge-containing materials in P-MOS recesses of the fin, in the presence of a dummy gate, as follows: forming a polysilicon dummy gate structure on the fin (block 728 of FIG. 3D); forming P-MOS recesses in the fin (block 730 of FIG. 3D); cleaning exposed P-MOS recess surfaces by a soft plasma treatment process of: (A) generating an electron beam parallel to the workpiece surface in a processing zone overlying the workpiece surface (block 734 of FIG. 3D), and (B) introducing an oxide reducing species precursor process gas into the processing zone (block 736 of FIG. 3D); after completion of the soft plasma treatment process, growing epitaxial layers of Ge or Ge-containing materials in P-MOS recesses of the fin (block 738 of FIG. 3D).

The process of FIG. 3D also forms N-MOS epitaxial regions of III-V compound materials and of Ge or Ge-containing materials in N-MOS recesses of the fin, as follows: forming N-MOS recesses in the fin (block 740 of FIG. 3D); removing native oxide from exposed N-MOS recess surfaces in a soft plasma treatment process of: (A) generating an electron beam parallel to the workpiece surface in a processing zone overlying the workpiece surface (block 744 of FIG. 3D), and (B) introducing an oxide reducing species precursor process gas into the processing zone (block 746 of FIG. 3D); after completion of the soft plasma treatment process, epitaxial layers containing group III-V compound materials are grown in the N-MOS recesses of fin (block 748 of FIG. 3D).

Figure 3E:
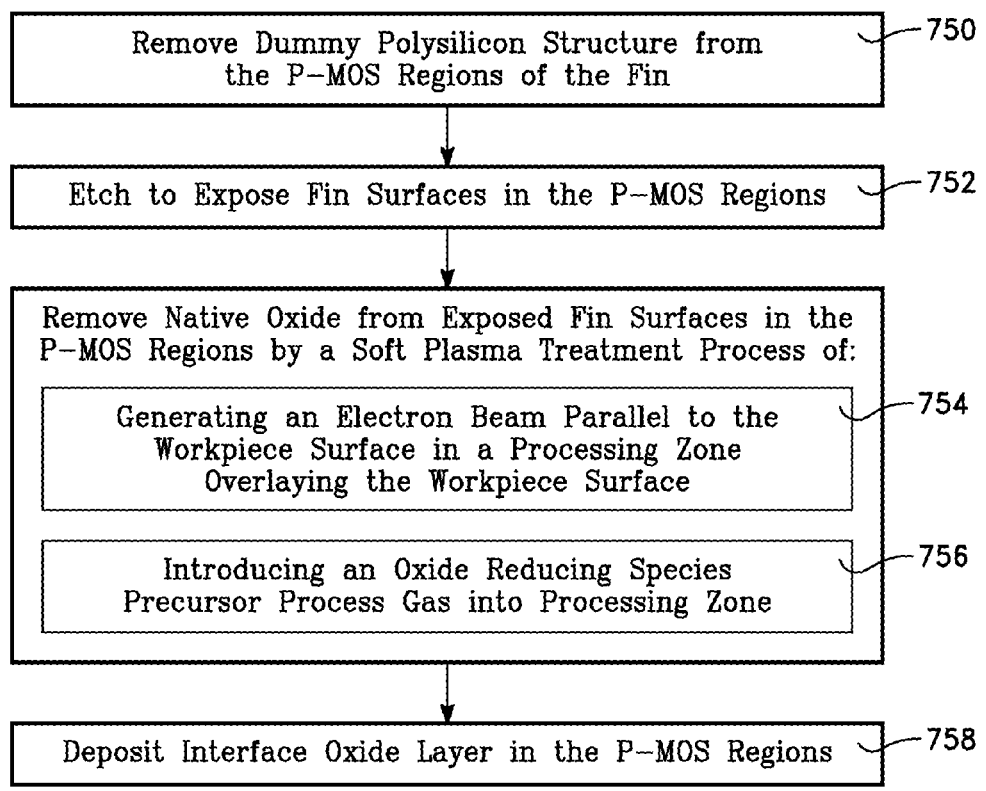

The process of FIG. 3E forms an interface passivation layer in the P-MOS regions of the fin, as follows: removing the dummy polysilicon gate structure from the P-MOS regions of the fin (block 750 of FIG. 3E); etching to expose fin surfaces in the P-MOS regions (block 752 of FIG. 3E); removing native oxide from exposed fin surfaces in the P-MOS regions by a soft plasma treatment process of: (A) generating an electron beam parallel to the workpiece surface in a processing zone overlying the workpiece surface (block 754 of FIG. 3E), and (B) introducing an oxide reducing species precursor process gas into the processing zone (block 756 of FIG. 3E); after completion of the soft plasma treatment process, an interface passivation layer is deposited in the P-MOS regions (block 758 of FIG. 3E).

Figure 3F:
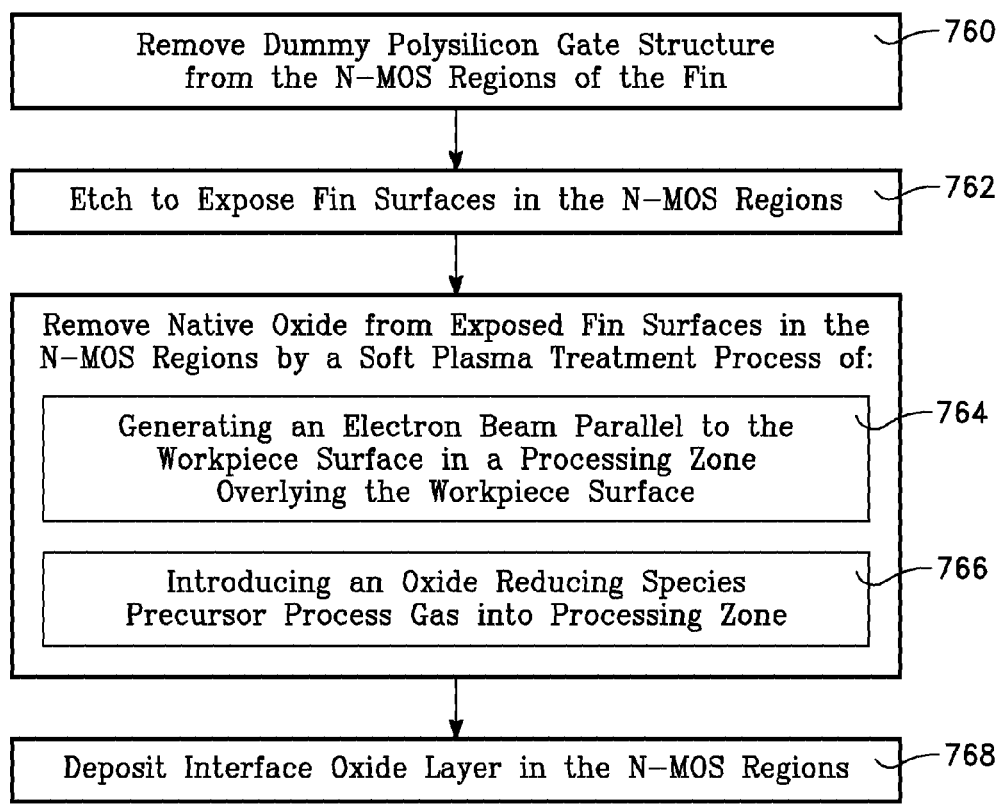

The process of FIG. 3F forms an interface passivation layer in the N-MOS regions of the fin, as follows: removing dummy polysilicon gate structures from the N-MOS regions of the fin (block 760 of FIG. 3F); etching to expose fin surfaces of the N-MOS regions (block 762 of FIG. 3F); removing native oxide from exposed fin surfaces in the N-MOS regions by a soft plasma treatment process of: (A) generating an electron beam parallel to the workpiece surface in a processing zone overlying the workpiece surface (block 764 of FIG. 3F), and (B) introducing an oxide reducing species precursor process gas into the processing zone (block 766 of FIG. 3F); after completion of the soft plasma treatment process, an interface passivation layer is deposited in N-MOS regions of fin (block 768 of FIG. 3F).

Figure 3G:
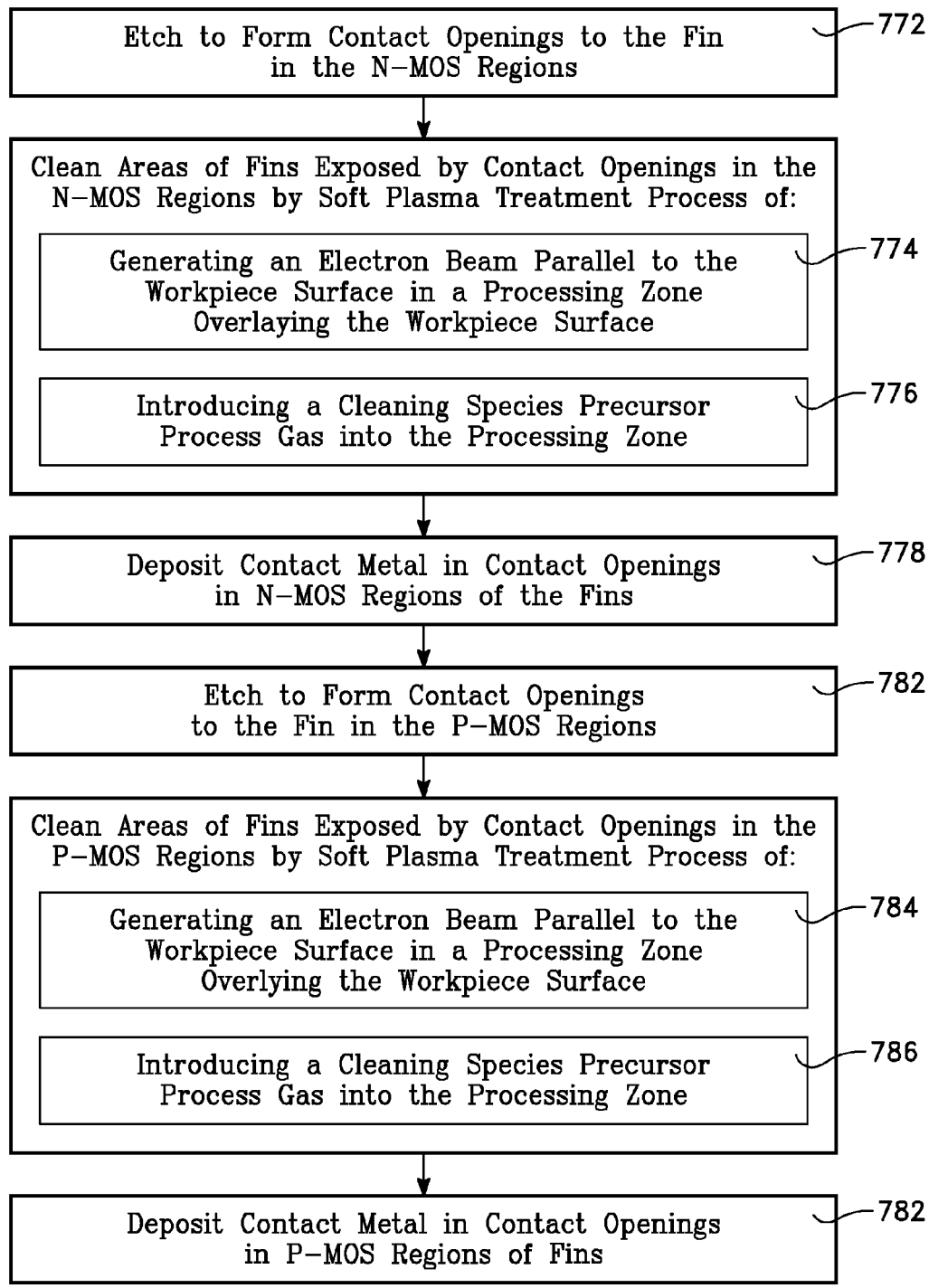

The process of FIG. 3G forms contacts in the N-MOS regions of the fin, as follows: etching through overlying layers (e.g., oxide and nitride) on the fin to form contact openings to the fin in the N-MOS regions (block 772 of FIG. 3G); cleaning areas of the fins exposed in contact openings in the N-MOS regions by a soft plasma treatment process of: (A) generating an electron beam parallel to the workpiece surface in a processing zone overlying the workpiece surface (block 774 of FIG. 3G), (B) introducing a cleaning species precursor process gas into the processing zone (block 776 of FIG. 3G); after completion of the soft plasma treatment process, contact metal is deposited in contact openings in N-MOS regions of the fins (block 778 of FIG. 3G).

The process of FIG. 3G also forms contacts in the P-MOS regions of the fin, as follows: etching through overlying layers (e.g., oxide and nitride) on the fin to form contact openings to the fin in the P-MOS regions (block 782 of FIG. 3G); cleaning areas of the fin exposed by contact openings in the P-MOS regions by a soft plasma treatment process of: (A) generating an electron beam parallel to the workpiece surface in a processing zone overlying the workpiece surface (block 784 of FIG. 3G), and (B) introducing a cleaning species precursor process gas into the processing zone (block 786 of FIG. 3G). After completion of the soft plasma treatment process, contact metal is deposited in contact openings in P-MOS regions of fins (block 788 of FIG. 3G). In one embodiment of the process of FIG. 3G, the etch operations of blocks 772 and 782 may be performed simultaneously, the e-beam generation operations of blocks 774 and 784 may be performed simultaneously, the process gas introducing operation of blocks 776 and 786 may be performed simultaneously, and the metal deposition operations of blocks 778 and 788 may be performed simultaneously.

While the foregoing is directed to embodiments of the present invention, other and further embodiments of the invention may be devised without departing from the basic scope thereof, and the scope thereof is determined by the claims that follow.

What is claimed is:

1. A method for treating a semiconductor surface of a semiconductor workpiece, comprising:
    directing an electron beam into a processing zone of a chamber containing said semiconductor workpiece, said electron beam propagating through said processing zone;
    introducing into said chamber a process gas comprising at least one of: (a) a cleaning species precursor, (b) a passivation species precursor, (c) an oxide reduction species precursor, whereby to generate a plasma while directly exposing said semiconductor surface to said plasma, and maintaining a plasma ion energy level of said plasma below a bonding energy of a material of said surface;
    forming in said surface at least one of: (a) N-MOS regions comprising group III-V compound semiconductor materials, (b) P-MOS regions comprising Ge or Ge-containing materials, wherein said forming in said surface at least N-MOS regions comprises:
        performing a first operation comprising epitaxially growing materials comprising Ge in said N-MOS regions in said surface;
        performing a second operation comprising epitaxially growing materials comprising group III-V compounds in said N-MOS regions in said surface;
        successively repeating said first and second operations;
        after each first operation of epitaxial growing material of Ge and prior to each second operation of epitaxial growing of group III-V compound material, performing a soft plasma surface treatment process comprising:
            (a) directing an electron beam into a processing zone of a chamber containing said semiconductor workpiece, said electron beam propagating through said processing zone in a propagation direction generally parallel to a plane of said surface; and
            (b) introducing into said chamber a process gas comprising a surface treatment precursor.

2. The method of claim 1 wherein said maintaining a plasma ion energy level below a bonding energy of a material of said surface comprises limiting electron temperature of said electron beam below a low electron temperature.

3. The method of claim 1 wherein said process gas comprises a passivation species precursor gas comprising Nitrogen.

4. The method of claim 1 wherein said process gas comprises a native oxide removal species precursor gas comprising Hydrogen.

5. The method of claim 1 wherein said process gas comprises a cleaning species precursor gas comprising at least one of HBr or HCl.

6. The method of claim 1 further comprising coupling RF bias power to said workpiece, and adjusting a level of said RF bias power to increase a level of ion energy of a plasma in said processing zone toward a bonding energy of the material of said surface.

7. The method of claim 6 further comprising exposing said workpiece to said plasma until a selected number of atomic layers has been removed from said surface.

8. The method of claim 1 wherein said forming in said surface at least P-MOS regions comprises:
    epitaxially growing materials containing at least one of (a) Ge or (b) Ge and Si in said surface.

9. The method of claim 1 wherein said process gas comprises a native oxide removal species precursor gas, said method further comprising depositing an interface oxide layer on said surface.

10. The method of claim 1 wherein said surface comprises a finFET structure.

11. The method of claim 2 wherein said low electron temperature is 0.5 eV.

* * * * *